United States Patent [19]

Rossler

[11] 4,091,359

[45] May 23, 1978

[54] MODULAR LOGIC CIRCUIT UTILIZING CHARGE-STORAGE TRANSISTORS

[75] Inventor: Bernward Rossler, Munich, Germany

[73] Assignee: Siemens Aktiengesellschaft, Munich, Germany

[21] Appl. No.: 768,833

[22] Filed: Feb. 15, 1977

[30] Foreign Application Priority Data

Feb. 20, 1976  Germany .............................. 2606958

[51] Int. Cl.² ...................... H03K 19/08; G06F 7/38; H04Q 3/42

[52] U.S. Cl. ........................... 340/166 R; 179/18 GF

[58] Field of Search ....... 179/18 GF, 18 GE, 18 EA, 179/18 ES; 340/166 R, 173 DR, 173 SP; 235/152, 156, 197; 307/207

[56] References Cited

U.S. PATENT DOCUMENTS

| | | | |
|---|---|---|---|
| 3,566,153 | 2/1971 | Spencer, Jr. ...................... | 340/166 R |
| 3,662,345 | 5/1972 | Shinohara et al. .............. | 340/166 R |
| 3,816,725 | 6/1974 | Greer ................................ | 340/166 R |
| 4,004,103 | 1/1977 | Liu et al. ......................... | 179/18 GF |

*Primary Examiner*—Thomas A. Robinson
*Attorney, Agent, or Firm*—Schuyler, Birch, Swindler, McKie & Beckett

[57] ABSTRACT

The present invention relates to a modular logic circuit, which is preferably utilized in a telephone switching system, comprising electronic logic elements using binary logic operation. The input terminals of the circuit have one input signal at a time applied to them whereupon an output signal is supplied through its output terminals; the output is dependent on how the modular circuit was previously set by electrical means. The logic elements comprise transistors in a matrix arrangement connected to horizontal and vertical lines. The modular circuit of the present invention is characterized in that it can be set any number of times by means of a first setting signal applied to the input terminals and a second setting signal applied simultaneously to the output terminals. The setting signal applied to the input terminals is fed to specified horizontal lines, while the setting signal applied to the output terminals affects at least one vertical line by way of selector switches that connect the output signal path to the output terminals.

13 Claims, 7 Drawing Figures

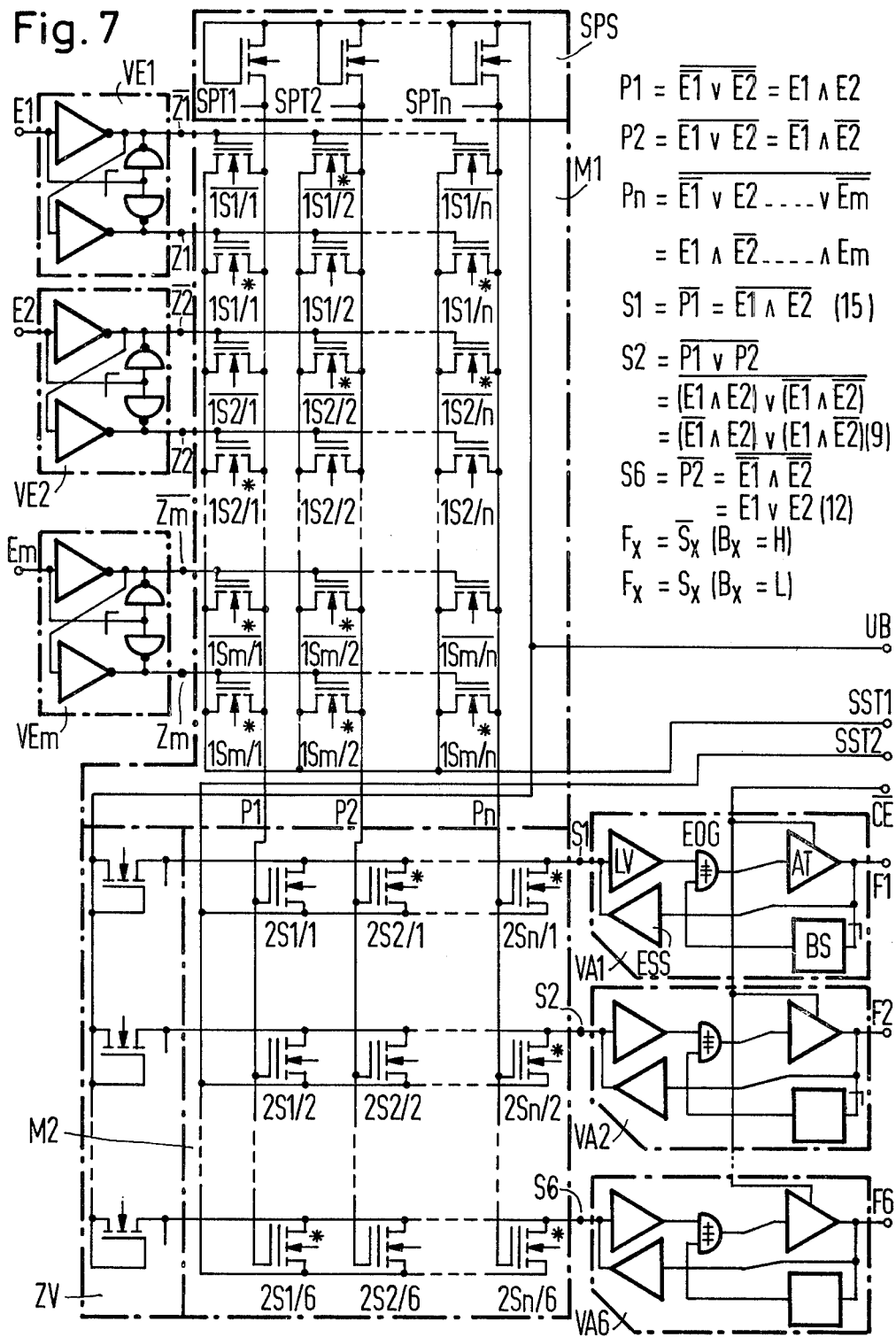

MODULAR LOGIC CIRCUIT UTILIZING CHARGE-STORAGE TRANSISTORS

BACKGROUND OF THE INVENTION

The invention relates to a modular logic construction circuit having input terminals to which one input signal at a time is applied, whereupon there is supplied through its output terminals an output signal which is also dependent upon how the modular circuit was previously set for this purpose via electrical means.

This type of modular circuit has found increasingly wide application as translators, code converters, program storages for the processing of input signals or also as microprogram storages.

It is a known practice to use series-connected combination matrices to obtain specified output signals which are to be derived from specified input signals. As is well known, any logic operation of variables may be represented by the sum of their products or by the product of their sums (cf. "Die Morgansche Gesetze" or "Die Verknupfung von zwei Variablen" in Reiss/Liedl/Spichall: "Integrierte Digitalbausteine", 1970, by Siemens Aktiengesellschaft, Berlin and Munich, p. 34 ff).

Prior art modular circuits that may be utilized for these purposes have such a matrix-type design. In those circuits logic elements are arranged at the intersections of horizontal and vertical lines of a first and a second combination matrix whereby specified horizontal lines can be connected together with specified vertical lines or disconnected from one another.

Modular circuits are found in the prior art wherein "logic elements" may be set to their first or secondary binary state in accordance with a predetermined function table at the fabrication stage by so-called mask programming, cf. MOS/LSI from Texas Instruments, October 1970, by TEXAS INSTRUMENTS INCORPORATED, page 152 ff: "programmable logic arrays", and a Texas Instrument Application Report, Bulletin CA-153, Kent Adres "MOS PROGRAMMABLE LOGIC ARRAYS". However, such modular circuits have the disadvantage that they are made in accordance with customers' specifications, so that high production cost and, hence, high prices per unit will result if small quantities are produced. Another disadvantage is that the predetermined function table of a mask-programmed module cannot be modified.

Another type of modular circuit found in the prior art has electrically-set logic elements. They may be set by the user himself, which results in lower prices in contrast to the aforementioned type, the mask-programmed modular circuits.

A subtype of these electrically-set modular circuits utilizes setting voltages to set the logic elements. Setting voltages, whose magnitudes stand out against normal working voltages, are applied to the input or output terminals, so that the logic elements, energized by excessive currents resulting from the setting voltages, are fused from horizontal or vertical lines. Such modular circuits are designated as "fusible programmable" (cf. SIGNETICS data sheet, OBJECTIVE SPECIFICATION, APRIL 1975: "BIPOLAR FIELD-PROGRAMMABLE LOGIC ARRAY 82S100, 82S101").

Another subtype of these electrically-set modular circuits has specially designed transistors as logic elements. These transistors are driven to the second breakdown when there is a flow of excessive current. This results in transfer of material from their emitter region to their base region. Thus, a diode is formed from a transistor (cf. Intersil, SE Spezial-Elektronic KG, provisional data sheet of January 1975 "ELEKTRISCH PROGRAMMIERBARE LOGIKMATRIX IM 5200").

This type of modular circuit has the disadvantage that, like mask-programmed modular circuits, they can be set only once for a specific function.

Notwithstanding, modular circuits exist in the prior art that can be set any number of times by electrical means, wherein the logic elements are realized at the crossings of horizontal and vertical lines by field-effect transistors having an electrically floating gate. Such electrically floating gates may be charged by applying appropriate setting potentials such that the particular logic elements will not subsequently be driven to their conducting states by subsequently applied control potentials. The inhibiting charging of such electrically floating gates may be canceled by a quenching process.

This type of prior art modular circuit is described in IBM Technical Disclosure Bulletin, Volume 17, No. 10, March 1975. In this arrangement there are provided per storage location, i.e., per crossing of a horizontal and a vertical line, two transistors, viz, one field-effect transistor having an electrically floating gate and one conventional field-effect transistor. By applying appropriate potentials the electrically floating gate of the particular field-effect transistor can be charged or discharged. The second conventional field-effect transistor assigned to the field-effect transistor equipped with the electrically floating gate is provided for switching on or off control circuits for the storage location. Such a modular circuit permits the setting of their storage locations any number of times via electrical means, thereby obviating the disadvantages of the previously described systems.

A disadvantage of this floating gate type modular circuit, however, is that at least two transistors are necessary per crossing of a horizontal and a vertical line of a combination matrix. Moreover, special control terminals must be provided for setting the logic elements having electrically floating gates.

The necessity of using two or more transistors per crossing results in greater circuit-space requirements per logic element and a correspondingly larger power dissipation. Furthermore, the necessity of using special control lead terminals is a disadvantage; the terminals utilized for this purpose can no longer be available for other functions of the module.

It is an object of the present invention to provide a modular circuit which does not exhibit the disadvantages enumerated hereinabove. The circuit-space requirements per crossing of horizontal and vertical lines must be small so as to achieve close packing of the component parts. Furthermore, dissipation must be small so that service life and operational reliability are greater than those provided in prior art systems. Finally, the terminals provided for the operation of the modular circuit must also be utilized for the setting of the logic elements; accordingly, the majority of these module terminals must still be available for other functions of its operation. One object of the invention is that no elements of any kind are necessary between the two series-connected combination matrices so that in addition to good economy of circuit-space and power dissipation it is also possible to provide for an optimum arrangement of conductor paths.

SUMMARY OF THE INVENTION

The present invention relates to a modular logic circuit, which preferably is utilized in a telephone switching system, comprising electronic logic elements using binary logic operation. The input terminal of the circuit has one input signal at a time applied to it whereupon an output signal is supplied through its output terminals; the output is dependent on how the modular circuit was previously set by electrical means. The logic elements comprise transistors in a matrix arrangement connected to horizontal and vertical lines.

The modular circuit built in accordance with the principles of the invention is characterized in that it can be set any number of times by means of a first setting signal applied to the input terminals and a second setting signal applied simultaneously to the output terminals. The setting signal applied to the input terminals is fed to specified horizontal lines, while the setting signal applied to the output terminals affects at least one vertical line by way of selector switches that connect the output signal path to the output terminals.

Advantageously, both input and output terminals are utilized for the setting, so that more possibilities are afforded than normally for distributing the setting signals among the existing logic elements. As a result, the logic elements may, for example, be included coordinate-wise for the setting. Accordingly, the signals required for the setting may have fewer signal elements. A further development of the invention is characterized in that the first setting signal is applied to specified horizontal lines of a first group of horizontal lines and that for the pertinent setting only logic elements are set that are connected to the specific horizontal lines of this group. In setting the logic elements connected to horizontal lines not associated with the first group (i.e., a second group), the previous setting of the logic elements are utilized. A third setting signal is applied to the input terminals that affects at least one vertical line by means of the set logic elements; simultaneously, a fourth setting signal is applied to the output terminals which affects specified horizontal lines of the second group, for which the previous connection of the output signal path is canceled.

Another further development of the invention is characterized in that a logic element is connected at the crossings of the horizontal and vertical lines. The logic elements can be set via electrical means by designing them as field-effect transistors having electrically floating gates. The charging-gate (Cg) and drain (D) terminals of the logic elements are connected to the corresponding horizontal or vertical lines, and the source (S) terminals of all logic elements are interconnected so that the logic elements, selectable at will, can be set through coincidence of potentials across their charging-gate and source and drain terminals.

The advantageous feature of these two further developments of the invention is the fact that one needs a smaller expenditure of modular circuit terminals necessary for transfer or control purposes and less circuit space for the logic elements at the crossings of horizontal and vertical lines. Moreover, the power dissipation of such a module is low.

The two matrices with the first group of horizontal lines and with the second group of horizontal lines are so designed that they are connected by common vertical lines reaching over both matrices. This, however, does not rule out that simple logic elements without special logic function, e.g., amplifiers or NOT elements, can still be inserted into the vertical lines. Besides the additional circuit-space economy and economy of dissipated heat resulting from the shared vertical lines there is the advantage that the modular circuit has a high operating speed.

BRIEF DESCRIPTION OF THE DRAWINGS

The following is a description of the invention with reference to the several figures:

FIG. 7 shows a general trunking scheme of a modular circuit having two matrices (M1 and M2), input amplifier VE, output amplifiers VA and column switches SPS.

DETAILED DESCRIPTION OF THE DRAWINGS

Figure 1:
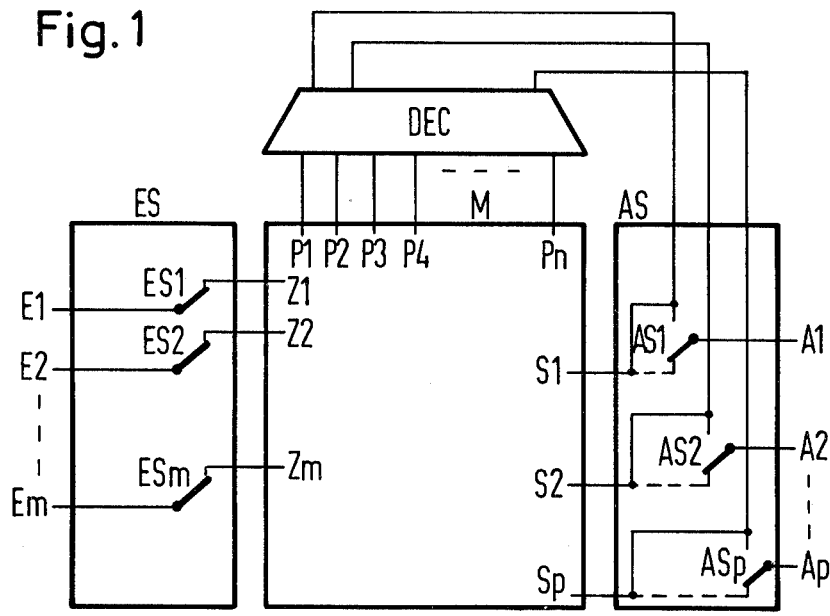
FIG. 1 shows the basic arrangement of the modular circuit in accordance with the invention in the form of a block diagram with gates ES1, ES2 . . . ES$m$ and selector switches AS1, AS2 . . . AS$p$ entered symbolically into input circuit ES and output circuit AS, respectively.

In the arrangement of FIG. 1 an input signal with its signal elements is applied to input terminals E1, E2 . . . E$m$. Switches ES1, ES2 . . . ES$m$ of input circuit ES are in the normal positions shown so that input terminals E1, E2 . . . E$m$ are connected with the horizontal lines Z1, Z2 . . . Z$m$ of a first group of horizontal lines within the programmable modular circuit. Selector switches AS1, AS2 . . . AS$p$ of output circuit AS are in the normal positions shown so that output terminals A1, A2 . . . A$p$ are connected with horizontal lines S1, S2 . . . S$p$ of a second group of horizontal lines within the part M to be connected of the modular circuit. Vertical lines P1, P2, P3, P4 . . . P$n$ are intersected by horizontal lines Z1, Z2 . . . Z$m$ as well as by horizontal lines S1, S2 . . . S$p$, whereby all intersections of the horizontal lines of the first group (Z1, Z2 . . . Z$m$) and the vertical lines (P1, P2, P3 . . . P$n$) form a first matrix M1. The intersections of the horizontal lines of the second group (S1, S2 . . . S$p$) and the vertical lines (P1, P2, P3 . . . P$n$) form a second matrix M2. The details are shown in FIG. 7, which will be explained further below.

Decoder DEC is connected with its inputs to the sides of the make contacts of selector switches AS1, AS2 . . . AS$p$ and with its outputs to the vertical lines P1, P2, P3, P4 . . . P$n$. The object of the decoder will be described hereinbelow.

As mentioned earlier, any logic functions of $m$ input variables can be achieved by serially connecting two combination matrices. The particular operation result may be deduced from outputs A1, A2 . . . Ap.

Figure 2:
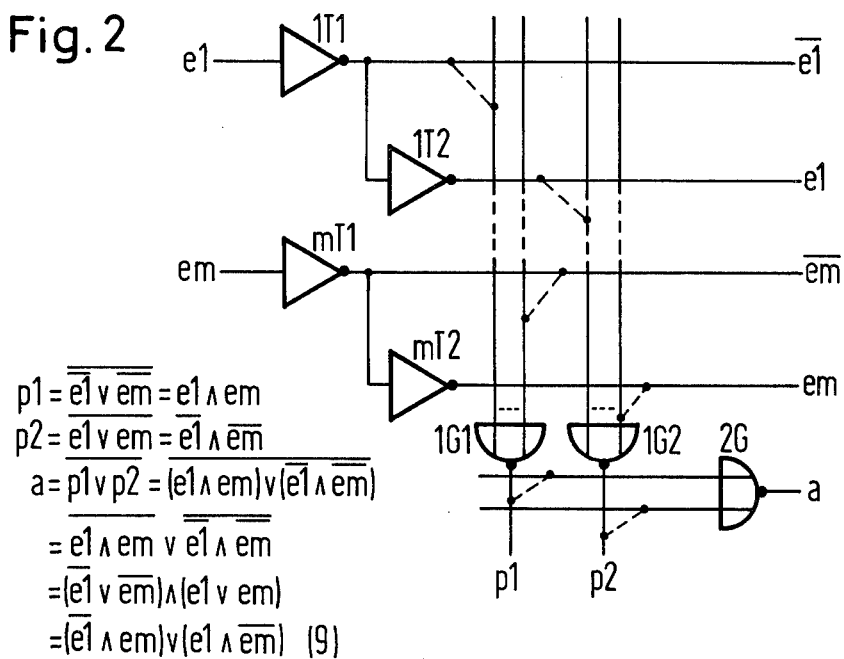
FIG. 2 shows an example of a combination circuit for various variables e1 to e$m$ by means of driver stages having negating outlet and a two-stage combination arrangement having NOR elements.

The circuit shown in FIG. 2 for the logical combination of several input variables el and em indicates one out of a total of 16 executable operations, viz. the exclusive OR operation.

What logic function shall be performed can be determined by means of the logic elements, designed as charge-storage transistors, with which any given interconnection of the outputs of the driver stages 1T1, 1T2 . . . mT1, mT2 can be carried out with the inputs of the logic elements 1G1, 1G2 of a first group. Any given interconnection of the outlets of these logic elements 1G1, 1G2 can be carried out with the inputs of the logic element 2G of a second group.

In the modular circuit designed in accordance with the teachings of this invention these logic elements are designed as combination matrices, whereby the functions of logic elements of the first group are performed in a first combination matrix and the functions of logic elements of the second group are performed in a second combination matrix. To achieve this, the outputs of the driver stages are connected to the horizontal lines of a first group (viz., the horizontal lines Z1, Z2, Zm) of the first matrix M1. Whereas the output terminals (A1, A2 . . . Ap) are connected to the horizontal lines of a second group (viz., the horizontal lines S1, S2 . . . Sp) of the second matrix M2. Both matrices share the vertical lines P1, P2 . . . Pn. The lines connected to the inputs of the NOR-gate 2G form a horizontal line S of the second group.

The connections that may be established at the intersections of horizontal and vertical lines are realized by individually allocated blocking or unblocking logic elements (viz., charge-storage transistors). The electrically floating gate of these charge-storage transistors must be charged negatively, depending on the logic function of the modular circuit (this corresponds to a connection not shown in FIG. 2) or not charged (this corresponds to a connection plotted at an intersection of a horizontal and a vertical line).

There are shown in FIG. 7 in the first matrix M1 and in the second matrix M2 individual logic elements some of which are marked with an asterisk. These logic elements marked for a setting example of both matrices are blocked, that is to say, their electrically floating gates are charged negatively, so that a positive control signal applied to the charging gates cannot bias into conduction the transistor involved. The logic elements marked with an asterisk are controlled in the usual manner.

The vertical lines P1, P2 . . . Pn form together with column transistors SPT1, SPT2 within a column switch SPS and connected separately to vertical lines P1, P2 . . . Pn and the charging-gate terminals of the logic elements, which are connected with their drain terminals to the horizontal lines the NOR-gates shown symbolically in FIG. 2. Accordingly, the horizontal lines of the second group (S1, S2 . . . S6) likewise form with the column transistors assigned individually to said horizontal lines and the charging-gate terminals of the logic elements, which are connected with their drain terminals to the aforesaid horizontal lines the NOR-gates shown symbolically in FIG. 2.

FIG. 7 shows a table with logical operation equations for the vertical lines P1, P2, Pn and the horizontal lines of the second group S1, S2 and S6. For example, if unblocked and blocked logic elements with E1, E2 being supplied to the input terminals, over the horizontal line S1 a NAND-operation (15) will occur, over the horizontal line S2 an exclusive OR-operation (9), and over the horizontal line S6 an OR-operation (12) of the two input signal elements will occur.

The list below gives an example which logic elements must be inhibited so as to achieve the 16 types of operations of two input variables, which are applied as signal elements to the input terminals E1 and E2. The output signal corresponding to the particular operation result can be derived from the horizontal line S1 for this example.

| Logic Elements | | | | | | | | | | Type of Operation |
|---|---|---|---|---|---|---|---|---|---|---|
| 1S̄1/1 | 1S̄1/2 | 1S1/1 | 1S1/2 | 1S̄2/1 | 1S̄2/2 | 1S2/1 | 1S2/2 | 2S1/1 | 2S2/1 | |
| * | * | * | * | * | * | * | * |  | * | (1) |
| * | * |  | * | * | * | * | * |  |  | (2) |
| * |  | * | * | * | * |  | * |  |  | (3) |
|  | * | * | * | * | * |  |  | * |  | (4) |
| * | * |  |  | * | * |  | * |  |  | (5) |
| * |  |  | * | * | * |  |  |  |  | (6) |
|  | * | * |  | * | * |  |  |  |  | (7) |
|  |  | * | * | * |  |  | * |  |  | (8) |
|  |  | * | * |  | * | * |  |  |  | (9) |
|  |  |  | * | * | * |  |  |  |  | (10) |
| * | * | * |  | * |  |  | * |  | * | (11) |
| * | * |  | * |  | * | * |  |  | * | (12) |
| * | * | * | * |  | * | * | * |  | * | (13) |
|  | * | * | * | * |  | * | * |  | * | (14) |
| * |  | * | * |  | * | * | * |  | * | (15) |
|  |  | * | * |  | * | * | * |  | * | (16) |

In this example listed above, all other logic elements shown in FIG. 7 in the first matrix M1, which are connected to the vertical lines P1 and P2 (viz., $\overline{1Sm/1}$, 1Sm/1, $\overline{1Sm/2}$ and 1Sm/2) as well as the logic element 2Sn/1 connected in the second matrix M2 to the horizontal line S1, must be inhibited for all 16 types of operations.

The types of operations are defined as follows:

| No. | Name | Boolean expression |
|---|---|---|
| (1) | Constant | S1 = L, where L corresponds to a low logic level (0) |
| (2) | Conjunction | S1 = E1 $\wedge$ E2 |
| (3) | Exclusion | S1 = E1 $\wedge$ $\overline{E2}$ |
| (4) | Exclusion | S1 = $\overline{E1}$ $\wedge$ $\overline{E2}$ |
| (5) | Nondisjunction | S1 = E1 $\vee$ E2 |
| (6) | Identity | S1 = E1 |
| (7) | Identity | S1 = E2 |
| (8) | Equivalence | |
| (9) | Exclusive-OR | S1 = ($\overline{E1}$ $\wedge$ $\overline{E2}$) $\wedge$ (E1 $\wedge$ E2) |
| (10) | Negation | S1 = ($\overline{E1}$ $\wedge$ E2) $\vee$ (E1 $\wedge$ $\overline{E2}$) |
| | | S1 = $\overline{E2}$ |

| No. | Name | Boolean expression |
|---|---|---|
| | | -continued |
| (11) | Negation | $S1 = \overline{E1}$ |
| (12) | Disjunction | $S1 = E1 \vee E2$ |
| (13) | Implication | $S1 = E1 \vee \overline{E2}$ |
| (14) | Implication | $S1 = \overline{E1} \vee E2$ |
| (15) | Nonconjunction | $S1 = \overline{E1 \wedge E2}$ |
| (16) | Constant | $S1 = H$, where H corresponds to a high logic level (1). |

The various types of operations, however, can also be achieved by other configurations. Likewise, other horizontal lines of the second group, e.g., S2 or S6 can be used for deriving output signals. Furthermore, an exclusive-OR element EOG built into the output amplifier VA1 . . . VA6 allocated individually to the lines and in cooperation with an individually assigned bistable switch BS permits the negation of a signal occurring on a horizontal line of the second group (viz., S1 . . . S6).

As generally known, every type of operation can be converted through negation of the output signal generated in each case into another type of operation in accordance with the following law:

(1) = (16)
 (2) = (15)
 (3) = (14)
 (4) = (13)
 (5) = (12)
 (6) = (11)
 (7) = (10)
 (8) = (9)

The possibilities of achieving equivalent types of operation with different configurations from inhibited and noninhibited switching elements of the first matrix M1 and of the second matrix M2, supplying output signals to various horizontal lines of the second group S1 . . . S6, and performing conversions through negation of output signals bestow upon the modular switch a high degree of flexibility and, thereby, a high utilization factor.

The bistable switches BS mentioned above also have for the setting of their two binary switching conditions individually allocated charge-storage transistors with electrically floating gates.

The modes of operation of the exclusive-OR elements EGO and of the bistable switches BS are described in conjunction with the further individual components of the output amplifiers VA1 . . . VA6, viz. the read amplifiers LV, the output drivers AT and the setting signal switches ESS.

Figure 3:
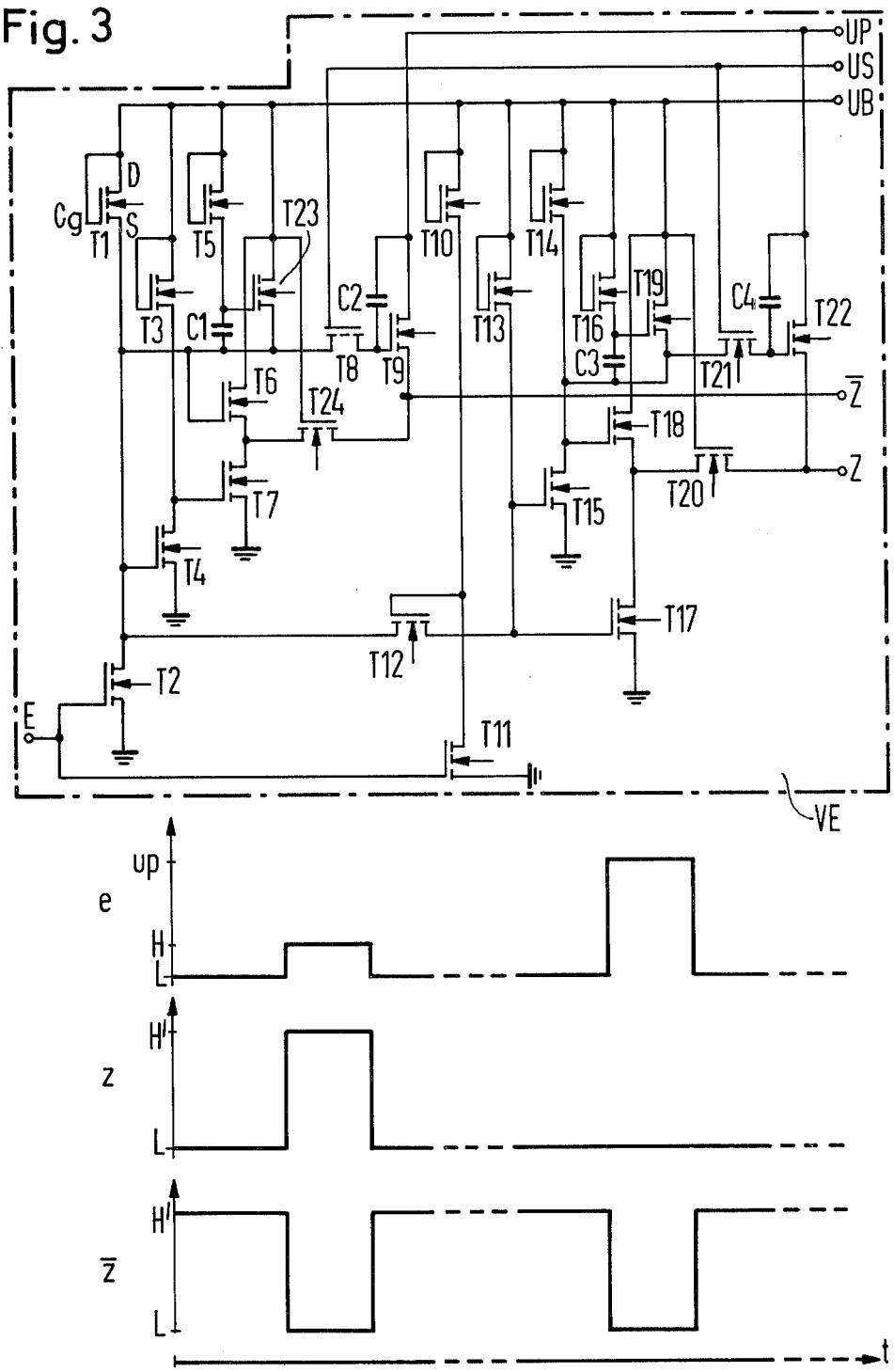
FIG. 3 shows a preferred embodiment of a circuit for an input amplifier VE with the associated functional logical operators.

FIG. 3 shows the circuit of an input amplifier VE. Such an input amplifier contains essentially two series-connected driver stages with inverting output, as apparent from FIG. 7. This circuit is designated in FIG. 7 as VE1, VE2 . . . VEm. Each of the inverting outputs is connected with an individually allocated horizontal line of a first group Z or $\overline{Z}$ of the part M to be joined of the modular switch. It is apparent from the time waveform diagrams that the horizontal signal Z and the inverted horizontal signal $\overline{Z}$ behave differently depending on the input signal e having different levels (viz., L, H, or up).

Upon applying an input signal e having the binary L corresponding to a zero level value to the input terminal E, a horizontal signal appears at the output terminal Z having the binary L; at the output terminal $\overline{Z}$ an inverted horizontal signal $\overline{Z}$ having the binary H'.

Upon applying an input signal e having the binary H to the input terminal E there appears at the output terminal the binary H'; at the output terminal $\overline{Z}$ the binary L.

Upon applying an input signal e with a higher level, up (i.e., the setting voltage) the signal at the output terminal Z takes on the binary L; whereas the signal at the output terminal $\overline{Z}$ likewise takes on the binary L. This behavior of such an input amplifier VE is shown symbolically in FIG. 7 with two NOT-elements, which may be influenced by way of a threshold element from the input terminal E.

By impressing the high positive setting voltage (up) upon a setting voltage terminal UP, this high positive setting voltage (up) can be connected to the input terminal E by applying an input signal e having the binary L. The output terminal Z generates a signal having the binary L.

If, on the other hand, an input signal e having the binary H is applied to the input terminal E, the setting voltage (up) is impressed on the output terminal Z. The output terminal $\overline{Z}$ sends a signal having the binary L.

The operation of the circuit of such an input amplifier VE will be described below for several distinct conditions (a-e), the individual control voltage (us) applied to terminal US is also considered.

Condition a:
 $e = L$
 $us = o$

The binary L, corresponding to a potential of about 0 volt, is impressed on the charging gate of transistors T2 and T11. The term "charging-gate " is here and in the following description used for "control-gate". The drain (D) and charging-gate (Cg) terminals of transistors T1 and T10 are connected to the operating voltage terminal UB, which supplies the positive working voltage ub. Transistors T1 and T10 are biased into conduction, so that their source (S) terminals are approximately at working voltage potential. Switch on potential is applied via the source terminal of transistor T1 to the charging gate of transistor T4, thereby rendering this transistor conductive so that positive potential applied through the conductive transistor T3 is driven to 0 volts. A positive charging-gate potential is applied to transistor T6 via the source terminal of transistor T1, so that the source terminal of transistor T6 assumes the working voltage potential (ub). Since the drain terminal of transistor T4 is approximately at 0 volts, transistor T7, whose charging-gate terminal is connected to the drain terminal of transistor T4, cannot be rendered conductive; consequently, the source potential of transistor T6 is supplied to the source terminal of transistor T24. The charging gate of transistor T24 is at working voltage potential (ub) so that this transistor is rendered conductive and the source potential is passed on to the drain terminal. The output terminal Z is connected to this drain terminal, so that it takes on positive potential, which corresponds to the binary H'. The source terminal of transistor T12 is connected to the drain terminal of transistor T2 which, for condition a, is at positive potential. The terminal of transistor T10 is at a positive potential, since transistor T11 is switched off.

The charging gate of transistor T12 is connected to the source terminal of transistor T10 and to the drain terminal of transistor T11. Transistor T12 is biased into conduction, so that the positive potential of the drain terminal of transistor T2 can be transferred to the charging gate of transistor T17. Since transistor T17 is conductive, the positive working voltage potential applied through transistor T18, which receives positive charging-gate potential via the drain and source terminal of transistor T14, cannot become effective at the source terminal of transistor T20. Transistor T20 receives charging-gate potential from the working voltage terminal UB, so that the drain potential of transistor T17 is supplied via the sourve region of transistor T20 to the drain region of transistor T20; consequently, the output terminal Z is virtually at 0 volt, corresponding to the binary L.

Condition b:

$e = H$
$us = O$

With the application of an input signal e having the binary H, corresponding to a positive potential, transistors T2 and T11 are biased into conduction. Thus, ground potential is transferred from the source terminals of these two transistors to their drain terminals. The W/L ratios of the two transistors T10 and T11 are designed differently so that transistor T11 has a comparatively high resistance in relation to transistor T10. As a result, when the binary H is applied to the input terminal E and, therefore, to the charging-gate terminal of transistor T11, the source and drain terminals of this transistor have sufficiently high resistance in relation to that of transistor T10, that the charging-gate terminal of transistor T12 still receives switch on potential via the source terminal of transistor T10.

In this way, the drain potential of transistor T2, which is simultaneously impressed on the source terminal of transistor T12, is transferred by means of the positive charging-gate potential of transistor T12 to the charging-gate terminal of transistor T17 and to the charging-gate terminal of transistor T15. Transistors T15 and T17 are thereby rendered nonconductive. Accordingly, positive potential is applied to the drain terminals of transistor T15 and T17 since the potential of transistor T14, which is at the positive working voltage potential, is transferred to the drain terminal of transistor T15. This potential on the drain terminal of transistor T15 is supplied to the charging-gate terminal of transistor T18; consequently, the positive working potential (ub), at the drain terminal of transistor T18, is supplied to the source terminal of transistor T18. Therefore, the source terminal of transistor T20 and the drain terminal of transistor T17 is at positive potential. Since a positive potential (ub) exists across the charging-gate terminal of transistor T20, the potential at the source terminal of transistor T20 is transferred to its drain terminal so that the output terminal Z is at positive potential, that is, it takes on the binary H'.

As explained above, the drain terminal of transistor T2 is approximately at 0 volt, so that transistor T4, whose charging-gate is likewise at this potential, cannot be biased into conduction. As a consequence, the positive working voltage potential (ub) is supplied by transistor T3 to the charging-gate terminal of transistor T7. As with the drain terminal of transistor T2, the charging-gate terminal of transistor T6 is approximately at 0 volt, therefore, transistor T6 is also rendered nonconductive. In this way, the potential of approximately 0 volt is transferred via the drain terminal of transistor T7 to the source terminal of transistor T24. The charging-gate terminal of transistor T24 is at the positive working voltage potential, so that transistor T24 is rendered conductive. Therefore, the low potential applied to the source terminal of transistor T24 is transferred via its drain terminal to the output terminal $\overline{Z}$; this corresponds to the binary L.

Condition c:

$e = up$
$us = O$

By connecting a setting voltage (up), which is higher in relation to the normal input signal level H, to transistors T2 and T11, these transistors become biased into conduction. Thus, their drain terminals are at approximately 0 volt. Transistor T11, which has a smaller W/L ratio in relation to transistor T10, now has such a low resistance in relation to transistor T10, due to the higher input voltage, that the charging-gate terminal of transistor T12 no longer receives an adequate switch on potential. In this way, the low potential which is applied to the drain terminal of transistor T2 and, thus, to the source terminal of transistor T12, cannot be transferred to the charging-gate terminal of transistor T17. Instead, the charging-gate terminal of transistor T17 is at a positive potential which is applied by way of transistor T13. The drain terminal of transistor T17 is driven to a low potential; accordingly, the source terminal of transistor T20 is likewise at a low potential. The charging-gate terminal of transistor T20 is permanently at the positive working voltage potential (ub), so that the drain terminal of this transistor, which is connected to the output terminal Z, is driven to a low potential. Consequently, the signal applied to the output terminal Z takes on the binary L.

The ground potential applied to the drain terminal of transistor T2, which is biased into conduction by the high potential (up) impressed on the input terminal E, is also transferred to the charging-gate terminal of transistor T4. Transistor T4 is made conductive by transistor T1 so that the drain terminal is approximately at a working voltage potential (ub) applied by way of transistor T3. The charging-gate terminal of transistor T7 is likewise at this potential so that its drain terminal is approximately at 0 volt. The drain terminal of transistor T6 which has a positive potential (ub) cannot increase the potential of the source terminal of transistor T6 and concomitantly the drain terminal of transistor T7, since the charging-gate terminal of transistor T6 is at approximately 0 volts. Therefore, the source terminal of transistor T24 is likewise at approximately 0 volt. Since the working voltage potential (ub) is fed to the charging-gate terminal of transistor T24, transistor T24 is biased into conduction, so that the low potential is transferred to the output terminal $\overline{Z}$. This output corresponds to the binary L. Thus, both output terminals, Z and $\overline{Z}$, have taken on the binary L.

Condition d:

$e = L$
$us = ub$

With the low potential corresponding to the binary L and applied to the input terminal E, transistors T2 and T11 remain switched off. As transistor T1 continually received switch on potential via its charging-gate terminal from the working voltage terminal UB, the source terminal of transistor T1, the charging-gate terminals of transistors T4 and T6, as well as the source terminals of transistors T23 and T8 are at high potential. Likewise, the source terminal of transistor T10 and, hence, the drain terminal of transistor T11, as well as the charging-gate terminal of transistor T12, remain at high potential. Transistor T4 is biased into conduction, so that the low potential across its source terminal is transferred to the source terminal of transistor T3 and to the charging-gate terminal of transistor T7. Transistor T6 is biased into conduction, with the result that its source terminal and, hence, the source terminal of transistor T24 are supplied with a high potential. The charging-gate terminals of transistors T8 and T21 for this condition *d* are supplied with the working voltage $ub(us = ub)$, so that both transistors are biased into conduction. The high potential impressed upon the source terminal of transistor T8, from transistor T1, is transferred to the charging-gate of transistor T9. This transistor (T9) is biased into conduction and carries the high potential of the setting voltage (up) applied from the setting voltage terminal UP via the drain and source terminals of transistor T9 to the output terminal $\bar{Z}$.

As mentioned earlier, the charging-gagte terminal of transistor T12 is at a high potential, so that the high potential applied to its source terminal is transferred to its drain terminal. As a consequence, the source terminal of transistor T13 and the charging-gate terminals of transistors T15 and T17 assume a high potential. Therefore, transistors T15 and T17 are biased into conduction so that the low potential applied to their source terminals can be transferred to their drain terminals. Thus, the source terminals of transistors T14, T29, and T21, as well as of the charging-gate terminal of transistor T18 are likewise at a low potential. Since the charging-gate terminal of transistor T20 is permanently at the working voltage (*ub*), it is biased into conduction so that the low potential applied to the drain terminal of transistor T17 can be transferred to the output terminal Z. Transistor T21, which is continually biased into conduction, for this condition *d*, supplies via its source and drain terminal a low potential to the charging-gate terminal of transistor T22, so that this transistor remains switched off. Thus, the high setting voltage (*up*) cannot be transferred to the output terminal Z, so the latter remains at a low potential.

Condition *e*:
$e = H$
$us = ub$

With the high potential corresponding to the binary H across the input terminal E, transistors T2 and T11 are biased into conduction. The drain terminal of transistor T2, the source terminals of transistors T1, T23, T8, T12 and the charging-gate terminals of transistors T4 and T6 assume a low potential.

The drain terminal of transistor T11 and, thus, the source terminal of transistor T10, and the charging-gate terminal of transistor T12 remain at high potential, since the W/L ratios of transistors T10 and T11, which form a voltage divider between the working voltage potential and the ground potential, are so devised that transistor T11 remains high-resistance in relation to transistor T10 upon application of the binary H to the charging-gate terminal of transistor T11. The drain terminal of transistor T4, which is not biased into conduction, and the charging-gate terminal of transistor T7 both remain at high potential; this potential is applied via the source terminal of transistor T3. Transistor T7 is biased into conduction so that its drain terminal and the source terminals of transistors T6 and T24 assume a low potential. The charging-gate terminal of transistor T24 is continually at a high potential, viz. the working voltage potential (*ub*), so that it is biased into conduction. This transfers the low potential impressed on the source terminal of transistor T24 to its drain terminal and hence to the source terminal of transistor T9 and to the output terminal $\bar{Z}$. For this condition e, transistor T8 receives across its charging-gate terminal the working voltage potential (*ub*) applied to the control voltage terminal US, so that T8 is biased into conduction and transfers the low potential impressed on its source terminal, via its drain terminal, to the charging-gate terminal of transistor T9. The drain terminal of transistor T9, which initially was at excessive potential, is driven to a low potential by transistor T24, which is biased into conduction. Transistor T12, whose charging-gate terminal is at high potential, connects the low potential applied to its source terminal to the charging-gate terminals of transistors T15 and T17 as well as to the source terminal of transistor T13. Since transistor T15 is not rendered conductive, the high potential connected via transistor T14 is applied to the source terminals of transistors T19 and T21 as well as to the charging-gate terminal of transistor T18. Consequently, a high potential is applied to the source terminals of transistors T18 and T20, as well as to the drain terminal of transistor T17, which is not biased into conduction. For this condition *e*, transistor T21 is with its charging-gate terminal at switch on potential, so that the high potential impressed on its source terminal can be connected to the charging-gate terminal of transistor T22. This renders transistor T22 conductive so that the excessive potential of the setting voltage (up) applied via the setting voltage terminal UP can be transferred to the source terminal of transistor T22 and, thus to the output terminal Z.

The capacitances C1, C2, C3 and C4, which may be designed as varactors in this practical example, form with the associated transistors T23, T9, T19 and T22 bootstrap circuits. Accordingly, the gate potentials of the particular transistors are augmented so as to avoid potential losses (cf. IEE Journal of Solid-State Circuits, Vol. Sc-7, No. 3, June 1972, pp 217–224, "Eliminating Threshold Losses in MOS Circuits by Bootstrapping Using Varactor Coupling").

Figure 4:
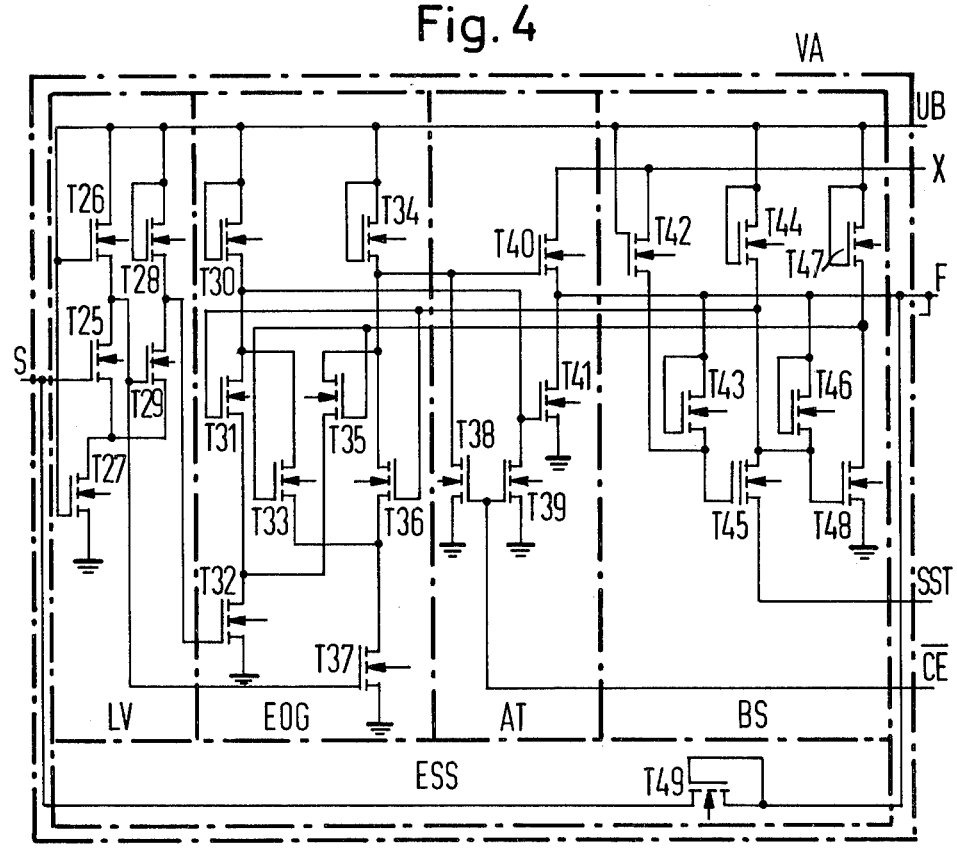
FIG. 4 shows a preferred embodiment of a circuit for an output amplifier VA with the associated functional logic operators.

FIG. 4 shows the constructional details of a circuit for a practical example of the output amplifier VA. This circuit is designated in FIG. 7 as VA1 . . . VA6. The circuit is divided into five sections: LV, EOG, AT, BS, and ESS.

Transistors T25, T26, T27, T28 and T29 form a read amplifier LV for signal elements occurring on the individually allocated horizontal line S associated with the second group.

An exclusive-OR element EOG is formed from transistors T30, T31, T32, T33, T34, T35, T36 and T37. Transistors T38, T39, T40 and T41 form an output driver AT.

Transistors T42, T43, T44, T45, T46, T47 and T48 form a bistable switch BS which can send signals with one or the other binary to the exclusive-OR element EOG by means of setting signals. Finally, transistor T49 forms a setting signal switch ESS, by means of which setting signals applied to the function output F can be carried to the particular horizontal line S of the second group of horizontal lines.

The various conditions *f, g, h, i, j, k* and *l* of such an output amplifier VA will be described hereinbelow:

| Condition f: | s = L |
|---|---|
| (T45 not switched off) | X = H |
| | SST = L |

-continued

| | |
|---|---|
| | $\overline{CE}$ = L |

With application of a signal element having the binary L, input transistor T25 of read amplifier LV is switched off. This causes the source terminal of transistor T26 and the drain terminal of transistor T25 to be at positive potential. This potential is simultaneously applied to the charging-gate terminals of transistors T29 and T37 within the exclusive-OR element EOG. The drain terminal of transistor T29 and the source terminal of transistor T28 are at low potential, so that transistor T32, in exclusive-OR element EOG, is switched off. Since it is assumed for this condition *f* that storage transistor T45 (in bistable switch BS) is not turned off, the source terminal of transistor T44 is at a low potential. The charging-gate terminals of transistors T31 and T36 also take on this low potential.

The above condition is achieved because input transistor T42, in bistable switch BS, has its charging-gate terminal at the working voltage potential (*ub*) and has its source terminal at a positive potential, from reversing terminal X, necessary for the reading operation. The drain terminal of transistor T42 is thus also rendered positive, with the result that the charging-gate terminal of charge-storage transistor T45 receives a switch on potential. As a result, the low potential at the control terminal SST, connected to the source terminal of T45, is also transferred to the drain terminal of storage transistor T45.

The charging-gate terminal of transistor T48 is connected with the drain terminal of charge-storage transistor T45, so that transistor T48 is turned off in the presence of a low potential across the drain terminal of storage transistor T45. Thus, the source terminal of transistor T47, whose charging-gate terminal is at operating voltage potential, is also at a positive potential. The charging-gate terminals of transistors T33 and T35 in exclusive-OR element EOG are connected to the source terminal of transistor T47 and the drain terminal of transistor T48. Transistors T33 and T35 are biased into conduction so that a low potential, which is supplied from transistor T37, is transferred to the drain terminal of transistor T33. For this condition f, a low potential is applied to control terminal $\overline{CE}$, so that transistors T38 and T39 in output drive AT are turned off. At this time, the drain terminals of transistors T31 and T33, as well as the source terminal of transistor T30 in exclusive-OR element EOC are at low potential; this potential is also supplied to the charging-gate terminal of transistor T41 in output driver AT. This low potential switches off transistor T41. A high potential is transferred from transistor T34 by its source terminal to the charging-gate terminal of transistor T40 in output driver AT. The positive potential at the reversing terminal X is transferred from the drain terminal of transistor T40 to its source terminal, thereby causing this potential to be applied to functional output F. Therefore, the corresponding signal element at functional output F has the binary H.

| Condition g: | s = L |
|---|---|
| (T45 switched off) | X = H |
| | $\underline{SST}$ = L |
| | $\overline{CE}$ = L |

A signal element having the binary L is applied to input terminal S. Storage transistor T45 is turned off; this causes a high potential to be applied to its drain terminal since a high potential exists at the source terminal of transistor T44. Since control terminal $\overline{CE}$ is at low potential, transistors T38 and T39 in output driver AT are switched off, as existed for condition *f*. Due to the high drain potential of storage transistor T45, the charging-gate terminal of transistor T48 is at switch on potential so that its drain terminal takes on a low potential. The charging-gate terminals of transistors T31 and T36 in exclusive-OR element EOG takes on a high potential, while the charging-gate terminals of transistors T33 and T35 take on a low potential. With application of a signal element having the binary L to the input terminal S there exists in read amplifier LV the same conditions as with condition *f*. Consequently, also transistor T32 in exclusive-OR element EOG receives the same charging-gate potential (i.e. low potential) so that this transistor remains switched off. Since transistor T31 receives a swtich on potential from the drain terminal of T45, the source terminal of transistor T31 is at a high potential due to the conduction of transistor T30. Transistor T36 likewise receives a switch on potential; consequently, a low potential from the drain terminal of conductive transistor T37 is transferred to the drain terminal of transistor T36. This causes a reverse potential to be applied to the charging-gate terminal of transistor T40 in output driver AT. The high potential of the source terminal of transistor T30 is also transferred to the charging-gate terminal of transistor T41, so that T41 is rendered conductive. Consequently, a low potential is supplied from the drain terminal of T41 to the functional output F. This low potential corresponds to binary L.

| Condition h: | s = H |
|---|---|
| (T45 not switched off) | X = H |
| | $\underline{SST}$ = L |
| | $\overline{CE}$ = L |

With application of a signal element having the binary H, input transistor T25 of read amplifier LV is biased into conduction. Thus, the source terminal of transistor T26 and the drain terminal of transistor T25 are at low potential. This potential is at the same time applied to the charging-gate terminals of transistors T29 and T37 in exclusive-OR element EOG. The drain terminal of transistor T29 and the source terminal of transistor T28 are at high potential, so that transistor T32 in exclusive-OR element EOG is made conductive. Thus, low potential is applied to the drain terminal of T32. Since it is assumed that storage transistor T45 in bistable switch BS is not switched off for this condition h, transistor T44 has its source region at a low potential; accordingly, the charging-gate terminals of transistors T31 and T36 are also at a low potential.

As with condition *f*, transistor T42 of bistable switch BS has its charging-gate terminal at operating voltage potential and has its source terminal, connected to reversing terminal X, also at a positive potential. This makes the drain terminal or transistor T42 positive, thereby causing a switch on potential to be supplied to the charging-gate terminal of charge-storage transistor T45. As a result, the low potential applied to control terminal SST is transferred from the source terminal of T45 to the drain terminal of transistor T45.

The charging-gate terminal of transistor T48 is connected to the drain terminal of charge-storage transistor T45, so that transistor T48 is turned off in the presence of low potential across the drain terminal of T45. Since T48 is turned off and the charging-gate terminal of T47 is at operating voltage potential, the source terminal of transistor T47 is at a positive potential. The charging-gate terminals of transistors T33 and T35, in exclusive-OR element EOG, are connected to the source terminal of transistor T47 and the drain terminal of transistor T48. The charging-gate terminals of transistors T33 and T35 are at switch on potential so that the source potential of transistor T32, which for this condition is biased into conduction, is transferred to the drain terminal of transistor T35. This source potential is also transferred to the source terminal of transistor T34, the drain terminals of transistors T36 and T38, and the charging-gate terminal of transistor T40. It is assumed for this condition $h$ that control terminal $\overline{CE}$ is at low potential, thereby causing transistors T38 and T39 to be turned off. The charging-gate of transistor T41 is connected to the source terminal of transistor T30 and to the drain terminals of transistors T31 and T33. Since the charging-gate terminal of transistor T31 is at reverse potential, the source terminal of transistor T30 and the drain terminal of transistors T31 and T33 are at a high potential. Accordingly, the charging-gate terminal of transistor T41 is also at a high potential. Transistor T41 becomes conductive so that a low potential is impressed on functional ouput F. This corresponds to binary L of the signal element concerned.

| Condition i: | s = H |
|---|---|
| (T45 switched off) | X = H |
| | SST = L |
| | $\overline{CE}$ = L |

The switching conditions of the transistors of read amplifier LV (viz., T25, T26, T27, T28 and T29) are equivalent to those in condition h. The charging-gate terminals of transistors T31 and T36 in exclusive-OR element EOG are at switch on potential, whereas the charging-gate terminals of transistors T33 and T35 are at reverse potential. As for condition h. transistor T31 has its charging-gate terminal at switch on potential, so that a low potential is impressed on its drain terminal. The charging-gate terminal of transistor T37 is at low potential, so that it is turned off. Since, for this condition, the charging-gate terminal of transistor T31 is at switch on potential, a low potential is applied to its drain terminal. This low potential is imparted to the charging-gate terminal of transistor T41 in output driver AT thereby disabling it. Since control terminal CE is at low potential, transistors T38 and T39 remain switched off. The charging-gate terminal of transistor T35 is at low potential. Accordingly, transistor T35 is turned off so that the low potential across the source terminal of transistor T32 will not be transferred to the drain terminal of transistor T35. Thus, the source terminal of transistor T34 is at high potential. This high potential effects the charging-gate terminal of transistor T40, thereby rendering it conductive so that the positive potential across reversing terminal X can be transferred to the source terminal of transistor T40 and, hence, to the functional output F. The signal element arising therefrom has the binary H.

Condition j:
$s = ./.$
$X = ./.$
$SST = L$
$\overline{CE} = H$

With high potential across control terminal $\overline{CE}$, the charging-gate terminals of transistors T38 and T39 in output driver AT are supplied with switch on potential. The drain terminals of transistors T38 and T39 receive a low potential, causing the charging-gate terminals of transistors T40 and T41 to receive reverse potential. As a result, functional output F receives neither high potential across the source terminal of transistor T40 nor low potential across the drain terminal of transistor T41. Functional output F is thus free of potential for this condition. This is true regardless of the type of potentials applied to input terminal S. This condition is utilized for the purpose of performing setting operations by applying exterior positive potential to functional output F, to transistor T49 which is part of the amplifier control switch ESS, and through input terminal S. These setting operations will be described hereinbelow.

Condition k: (switching off charge-storage transistor T45
$F = up$
$X = up$
$SST = L$
$\overline{CE} = H$ The negative charging of the floating gate required for turning off charge-storage transistor T45 is achieved through simultaneous application of a sufficiently high voltage between charging-gate and source terminals, on the one side, and drain and source terminals, on the other, with low potential being impressed on the source terminal. To accomplish this, a positive setting voltage (up) is connected to functional output F. To prevent the high setting potential across F from producing strong currents across transistors T40 and T41 there is applied to control terminal $\overline{CE}$ a high potential. Consequently, transistors T38 and T39 are biased into conduction. The drain terminals of transistors T38 and T39 connect low potential to the charging-gate terminals of transistors T40 and T41, which are switched off as a result.

The high potential of control terminal X is connected across transistor T42 to the charging-gate terminal of charge-storage transistor T45. The high setting potential applied to functional output F biases transistor T46 into conduction, which otherwise is high-ohmic due to its W/L ratio. Accordingly, the setting potential from F is transferred from transistor T46, which now has become low ohmic, to the drain terminal of charge-storage transistor T45. In this way, the coincidence of two high positive potentials across the charging-gate and drain terminals, necessary for setting this charge-storage transistor is achieved. The electrically floating gate is charged negatively, with the result that transistor T45 remains switched off for positive control potentials applied in subsequent process.

Condition l (unblocking of charge-storage transistor T45):
$F = ./.$
$X = L$
$SST = ul$
$\overline{CE} = H$ The charge-storage transistor T45 can be unblocked in two ways. The unblocking may be effected either through radiation with ultraviolet light through a silica-glass hole on the module or through electrical processes.

For the second type of unblocking, a ground potential is applied to the charging-gate of charge-storage transistor T45 by applying to the reversing terminal X a correspondingly low potential. This charging-gate terminal of charge-storage transistor T45 by transference of this potential from the source to the drain terminal of transistor T42. At the same time, there is applied to the source terminal of charge-storage transistor T45 a positive extinction voltage ul, which slowly increases until it attains its final value. This is possible, because the source terminal of the charge-storage transistor is not permanently connected to a specified potential, like the other transistors. Rather, it is connected to source control terminal SST, to which either a high or a low exterior potential may be connected.

The practical example of the modular circuit shown in the accompanying figures provides that all the charge-storage transistors, both those designated in matrices M1 and M2 as switching elements and those designated as charge-storage transistors T45 incorporated in the six output amplifiers VA, are connected with their source terminals to the source control terminal SST. Thus, all charge-storage transistors can easily be unblocked simultaneously.

Figure 5:
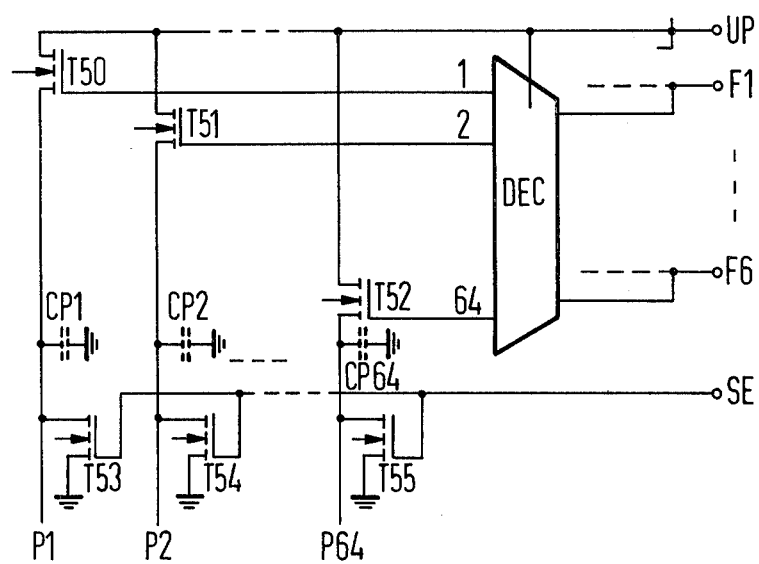
FIG. 5 shows a preferred embodiment of a circuit for a column switch.

FIG. 5 shows a practical example of a column switch whereby, in the setting of charge-storage transistors in the matrices M1 and M2, one can select any column of 64 columns (viz., P1, P2 . . . P64) by applying a special binary word to the six functional outputs F1 . . . F6 for each column to be selected. One out of 64 outlets of decoder DEC can be activated in a manner known in the prior art. Outlets 1, 2 . . . 64 lead to the charging-gate terminals of individually allocated transistors T50, T51 . . . T52. The drain terminals of these transistors are all routed to the setting voltage terminal UP to which a setting voltage (up) is applied for the duration of a setting operation. For example, when outlet 1 of the decoder is activated, the individually allocated transistor T50 is biased into conduction, which connects the setting voltage potential via the setting voltage terminal UP and the drain and source terminal of transistor T50 to the entire vertical line P1. All other vertical lines may be selected in the same manner.

Technologically conditioned spurious capacitances (CP1, CP2 . . . CP64) are shown in FIG. 5 for vertical lines P1, P2 . . . P64. These capacitances can be charged during a setting operation. An individual discharging switch (T53, T54 . . . T55) is provided for each vertical line to break down the interfering charges. The charging-gate terminals of these discharging switches are all connected to a discharge control terminal SE, to which a positive discharge control potential is applied, for biasing the discharging switches into conduction. These switches act as discharging circuits to eliminate any spurious capacitances.

Furthermore, the above-mentioned decoder DEC may be connected with its inlets to modular terminals that are not required for further purposes.

Figure 6:
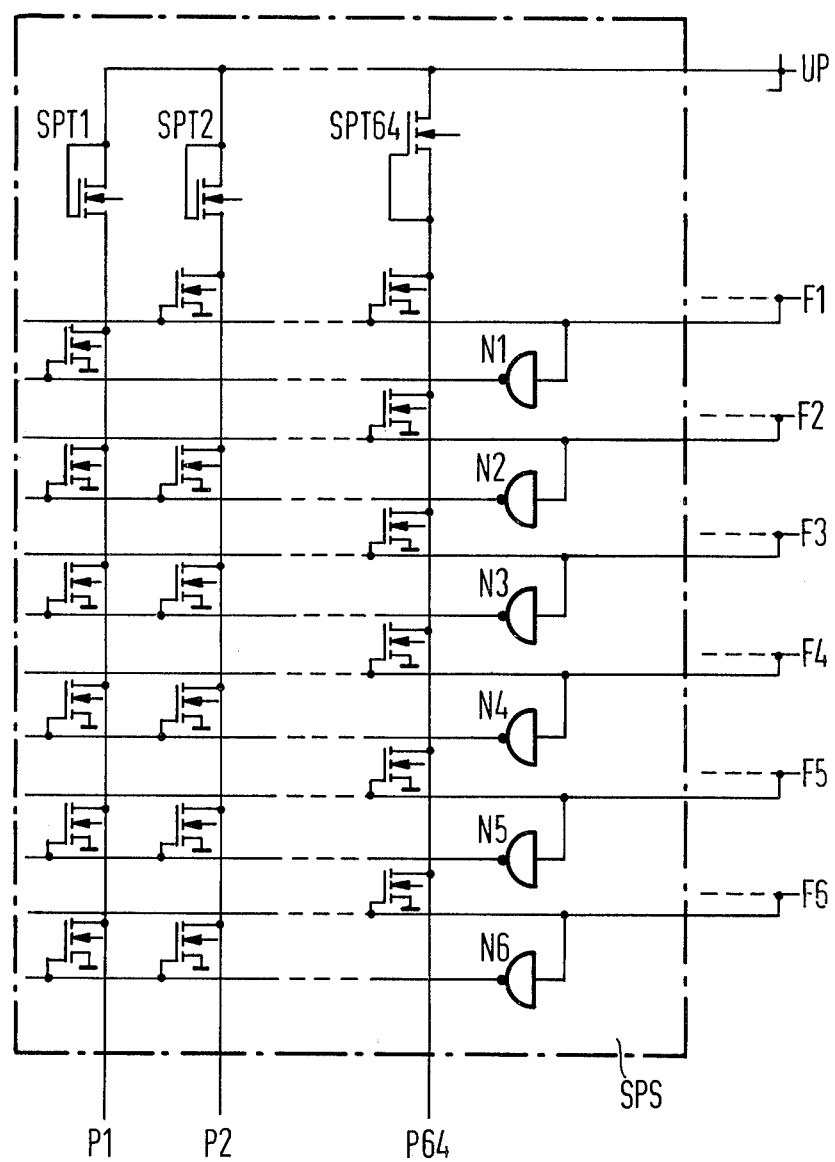
FIG. 6 shows another preferred embodiment of a circuit for a column switch wherein a selection from 64 vertical lines P1, P2 . . . P64 is effected by the arrangement of a NOR matrix.

FIG. 6 shows another practical example of a column selector means whereby binary words corresponding to the vertical line to be selected (viz., P1, P2 . . . P64) are routed via functional outputs. As in the practical example shown in FIG. 5, there is also provided for each vertical line to be selected individual column transistors (SPT1, SPT2 . . . SPT64). The drain and charging-gate terminals of each transistor has a setting voltage (up) applied via the setting voltage terminal UP.

In conformity with the binaries of the signal elements applied to functional outputs F1–F6, the charging-gate terminals of the first auxiliary transistors which are connected directly to said functional outputs or the charging-gate terminals of the first auxiliary transistors which are connected indirectly via NOT-elements (N1–N6) may be influenced by way of further auxiliary transistors, so that the first auxilliary transistors are correspondingly biased into conduction or turned off.

The arrangement is a matrix-type NOR logic device. The vertical line in which the setting voltage potential applied across the individually allocated column transistor SPT. . . is not derived by way of an auxiliary transistor biased into conduction is considered selected, so that the charge-storage transistors connected to this vertical line and functioning as switching elements have to be adjusted. All other 63 vertical lines that are provided in this practical example carry low potential, so that the switching elements connected thereto cannot be adjusted.

The column-selection transistors SPT1, SPT2 . . . SPT64 may be designed either an $n$-channel enhancement-mode or depletion-mode MOS transistors. What type of transistor is chosen depends on the allowable power dissipation and the allowable power consumption of this module. For example, in FIG. 6 the charge-storage transistors SPT1 and SPT2 are shown as enhancement-mode transistors and the column transistors SPT64 as a depletion-mode transistor. It stands to reason that as a rule all these transistors must be provided either as enhancement-mode or as depletion-mode transistors.

FIG. 7 shows a general connecting scheme for a practical example of the modular circuit which, in addition to the essential arrangements of the invention shown in FIG. 1 and the further arrangements illustrated in FIGS. 3–6 shows the circuit-constructional details of the combination of two matrices M1 and M2. As explained earlier, any desired combination of signal elements applied to input terminals E1, E2 . . . E$m$ can be effected according to any desired function by means of a modular circuit comprising essentially two series-connected combination matrices.

The desired switching function is determined by three parameters, as follows:
  by the effectiveness or ineffectiveness of logic elements 1S . . . $\overline{1S}$ . . . at the intersections of the horizontal lines of the first group and the vertical lines within the first matrix M1;
  by the effectiveness or ineffectiveness of logic elements 2S . . . at the intersections of the vertical lines and the horizontal lines of the second group within the second matrix M2; and
  by the binary switching conditions of the various bistable switches BS1, BS2 . . . BS6 within the output amplifiers VA1, VA2 . . . VA6.

The operating modes of input amplifier VE shown in FIG. 7, output amplifier VA having bistable switches BS, and column switch SPS were described earlier.

The following is a description of the various types of setting operations of logic elements 1S . . . , and $\overline{1S}$ . . . , of the first matrix M1 and of logic element 2S of the second matrix M2, the blocking and unblocking of these logic elements.

The blocking of the logic elements in the first combination matrix M1 may be effected in the following two ways designated as conditions $m$ and $n$:

Condition $m$ (column-wise blocking of logic elements $1S \ldots /\overline{1S} \ldots$:

For the column-wise blocking of logic elements $1S \ldots /\overline{1S} \ldots$ of the first matrix M1 there are applied to input terminals E1, E2 . . . E$m$ signals having signal elements that are converted into high-level line signals corresponding to the setting voltage within input amplifiers VE1, VE2 . . . VE$m$ using a setting voltage ($up$) connected to the setting voltage terminal UP and a control voltage ($us$) connected to control voltage terminal US.

Depending on the binary (L or H) of a signal element applied to an input terminal E a high and low positive potential (about 0 volt) appears across the relevant output terminal Z and the inverted output terminal $\overline{Z}$, respectively. The turn-off of a charge-storage transistor used as a switching element ($1S \ldots /\overline{1S} \ldots$), as explained in the introduction, is done by connecting simultaneously to its charging-gate and drain terminal a positive potential which is excessive in relation to its source potential. This causes the negative charging of the electrically floating gate. Read signals with standard level (i.e., the binary H') applied subsequently to the charging-gate terminal of such a turned-off charge-storage transistor cannot bias it into conduction.

As explained above, in FIG. 7, certain logic elements in the first matrix M1 are marked with an asterisk. The markings indicate which of the logic elements ($1S \ldots /\overline{1S} \ldots$) are to be blocked in the given example, that is, in column P1 the switching elements 1S1/1, 1S2/1, $\overline{1Sm/1}$, and 1S$m$/1, in column P2 the logic elements $\overline{1S1/2}$, $\overline{1S2/2}$, $\overline{1Sm/2}$ and 1S$m$/2, and in column P$n$ the logic element 1S$m$/$n$.

It can be seen from the descriptions of conditions d and e of input amplifiers VE which potentials appear across output terminals Z and $\overline{Z}$ as a result of an input signal having the binary L or H applied to the relevant input terminal E. With the application of a low potential (i.e., the binary L) to input terminal E, a low potential (i.e., binary L) appears across output terminal Z and an excessive positive potential (i.e., the binary H'') appears across output terminal $\overline{Z}$. With application of a high potential (viz., the binary H) to input terminal E the conditions at the output terminals are reversed; that is, an excessive positive potential (i.e., binary H'') appears across output terminal Z and a low potential (i.e., binary L) appears across output terminal $\overline{Z}$.

For the settings assumed in the example, first the vertical line P1 to which the drain terminal of logic elements $\overline{1S1/1}$, 1S1/1, $\overline{1S2/1}$, 1S2/1 . . . $\overline{1Sm/1}$ and 1S$m$/1 are connected must receive setting voltage potential. This may be done, inter alia, in accordance with one of the two methods already mentioned above under FIGS. 5 and 6. Subsequently, the following signals are applied with a first clock pulse to input terminals E1, E2 . . . E$m$:
$e1=H$ (is converted into $Z1=H''$, $\overline{Z1}=L$)
$e2=H$ (is converted into $Z2=H''$, $\overline{Z2}=L$) . . .
$em=H$ (is converted into $Zm=H''$, $\overline{Zm}=L$)

Thus, logic elements 1S1/1, 1S2/1 and 1S$m$/1 are blocked, because for them the coincidence-required for the blocking-of excessive positive and charging-gate potential in relation to the common source potential is fulfilled. With a second clock pulse the following signal elements are applied to input terminals E1, E2 . . . E$m$:
$e1=H$ (is converted into $Z1=H''$, $\overline{Z1}=L$)
$e2=H$ (is converted into $Z2=H''$, $\overline{Z2}=L$) . . .
$em=L$ (is converted into $Zm=L$, $\overline{Zm}=H'$)

In this operation the logic element $\overline{1Sm/1}$ is likewise blocked. Thus, all logic elements for column line P1 in the first matrix M1 are set.

Then follows the blocking of logic elements $\overline{1S1/2}$, $\overline{1S2/2}$, $\overline{1Sm/2}$ and 1S$m$/2 of vertical line P2. To accomplish this, setting voltage potential is applied to vertical line P2. Subsequently, signal elements following with a third clock pulse are applied to input terminals E1, E2 . . . E$m$:
$e1=L$ (is converted into $Z1=L$, $\overline{Z1}=H''$)
$e2=L$ (is converted into $Z2=L$, $\overline{Z2}=H''$) . . .
$em=L$ (is converted into $Zm=H''$, $\overline{Zm}=L$).

Thus, logic elements $\overline{1S1/2}$, $\overline{1S2/2}$ and $\overline{1Sm/2}$ are blocked. With a fourth clock pulse the following signal elements are applied to input terminals E1, E2 . . . E$m$:
$e1=L$ (is converted into $Z1=L$, $\overline{Z1}=H''$)
$e2=L$ (is converted into $Z2=L$, $\overline{Z2}=H''$) . . .
$em=H$ (is converted into $Zm=H''$, $\overline{Zm}=L$).

In this operation, switching element 1S$m$/2 is also blocked. Thus, all switching elements of vertical line P2 in first matrix M1 are set.

Then follows the blocking of logic elements 1S1/$n$, $\overline{1S2/n}$ and 1S$m$/$n$ of vertical line P$n$. To achieve this, setting voltage potential is applied to vertical line P$n$. Subsequently, the following signal elements are applied to input terminals E1, E2 . . . E$m$:
$e1=H$ (is converted into $Z1=H''$, $\overline{Z1}=L$)
$e1=L$ (is converted into $Z2=L$, $\overline{Z2}=H''$) . . .
$em=H$ (is converted into $Zm=H''$, $\overline{Zm}=L$).

This causes logic elements 1S1/$n$, $\overline{1S2/n}$ and 1S$m$/$n$ to be blocked.

A further clock pulse is not necessary, because all logic elements of vertical line P$n$ in first matrix M1 have been set.

Thus, a maximum of 2$n$ setting clock pulses for logic elements of first matrix M1 are required. For the hitherto described simultaneous setting of various logic elements of a vertical line there flows a relatively strong current by way of column transistors SPT1 . . . SPT$n$ concerned. Hence, the column transistors must be relatively high-ohmic, that is to say, constructed with a large W/L ratio so as to reduce to a minimum the voltage drop across its drain and source region. In modules having a large number of vertical lines, this condition can be a disadvantage in that such a column transistor occupies a comparatively large space. In that case, it is advantageous to block the logic elements of a vertical line sequentially, that is to say, only one logic element at a time is influenced at the intersection of a vertical line and a horizontal line in first matrix M1.

Condition $n$ (individual blocking of logic elements 1S . . . /$\overline{1S} \ldots$):

After selecting the relevant vertical line, the signal elements with the potentials necessary for the desired setting are applied, one signal at a time, to input terminals E1, E2 . . . E$m$ with a view to blocking the logic elements individually with the setting potential (viz., H'') being applied to the charging-gate terminal of the logic element to be blocked in the manner described earlier. Low potential to the binary L is applied to all further switching elements, whose charging-gate terminals can be reached across the other input terminals.

If, for example, switching element 1S1/1 is to be blocked individually, signal elements following a first clock pulse are to be supplied to input terminals E1, E2 . . . E$m$:
$e1=H$ (is converted into $Z1=H''$, $\overline{Z1}=L$)
$e2=up$ (is converted into $Z2=L$, $\overline{Z2}=L$) . . .

$em = up$ (is converted into $Zm=L$, $\overline{Zm}=L$).

Thus, with this potential configuration there exist only for the selected switching element the conditions necessary for blocking. By applying signal elements having the setting voltage $up$ across input terminals E2 . . . E$m$, the output terminals Z2, $\overline{Z2}$ . . . Z$m$ and $\overline{Zm}$ take on the binary L.

The following signal elements are supplied with a second clock pulse:

$e1 = up$ (is converted into $Z1=L$, $\overline{Z1}=L$)
$e2 = H$ (is converted into $Z2=H''$, $\overline{Z2}=L$) . . .
$em = up$ (is converted into $Zm=L$, $\overline{Zm}=L$).

This blocks logic element 1S2/1.

With the next to last clock pulse the following signal elements are supplied:

$e1 = up$ (is converted into $Z1=L$, $\overline{Z1}=L$)
$e2 = up$ (is converted into $Z2=L$, $\overline{Z2}=L$) . . .
$em = H$ (is converted into $Zm=H''$, $\overline{Zm}=L$).

This blocks logic element 1S$m$/1. The last clock pulse causes the following signal elements to be supplied:

$e1 = up$ (is converted into $Z1=L$, $\overline{Z1}=L$)
$e2 = up$ (is converted into $Z2=L$, $\overline{Z2}=L$) . . .
$em = L$ (is converted into $Zm=L$, $\overline{Zm}=H''$).

Logic element $\overline{1Sm/1}$ is blocked with this last clock pulse. The logic elements in the case of the other column lines are adjusted in the same fashion.

Various methods will now be described according to which the logic elements of the second matrix M2 (i.e., 2S1/1, 2S1/2 . . . 2S1/6; 2S2/1, 2S2/2 . . . 2S2/6; 2S$n$/1, 2S$n$/2 . . . 2S$n$/6 must be adjusted Condition $o$ (linewise blocking of logic elements 2S . . .)

The logic elements concerned are of the same type of charge-storage transistor as those in the first logic matrix M1. The blocking of such a switching element is again effected by means of positive potentials applied in coincidence to the charging-gate and drain terminals while excessive in relation to the source potential. As was explained above, an output amplifier VA may be influenced by an appropriate signal at control terminal $\overline{CE}$ such that a signal at the input terminal S is not transmitted to the functional output F. This may be obtained since output driver AT, in output amplifier VA, may be deactivated upon application of a signal having the binary H.

Thereafter, it is possible to apply an exterior setting voltage potential to the modular circuit across said functional output F for the purpose of setting the logic elements. Transistor T49, in output amplifier VA and setting signal switch ESS, is thereby rendered conductive. The signal applied to functional output F can reach through to input terminal S. Through appropriate supply of signals it is now possible to select any desired horizontal lines S within the second group of horizontal lines (i.e., in the second combination matrix M2) and thereby select the logic elements connected with their drain terminals to the respective horizontal lines S. Setting voltage potential is applied to setting voltage terminal UP of column switch SPS (FIG. 6). This biases into conduction column transistors SPT1, SPT2 . . . SPT64, which apply this potential to the vertical lines connected to the charging-gate terminals of logic elements 2S . . . in the manner indicated above.

With this method all logic elements can be blocked that can be reached alternatively over one or more horizontal lines.

A more differentiated method will be given below.

Condition $p$ (columnwise blocking of switching elements 2S . . .)

Logic elements 2S . . . of second matrix M2 can be blocked according to this condition by utilizing the preceding setting of logic elements 1S . . . /$\overline{1S . . .}$ of first matrix M1. To achieve this, setting voltage potential is first impressed upon setting voltage terminal UP of column switch SPS (FIG. 6 and accompanying comments). Column transistors SPT1, SPT2 . . . SPT$n$ are biased into conduction and supply this potential to all vertical lines P1, P2 . . . P$n$.

Subsequently, signal elements having suitable binaries are supplied to input terminals E1, E2 . . . E$m$ for the purpose of selecting a specified vertical line. The signal $e$ required in each case must have a bit configuration so that the charging-gate terminal of no unblocked logic element 1S . . . $\overline{1S . . .}$ of the vertical line to be selected (e.g., $\overline{1S1/1}$ and $\overline{1S2/1}$ of vertical line P1) is at break potential. Thus, according to the example illustrated in FIG. 7, signal elements having the following binaries are suitable:

$e1 = H$ (is converted into $Z1=H'$, $\overline{Z1}=L$)
$e2 = H$ (is converted into $Z2=H'$, $\overline{Z2}=L$) . . .
$em = H$ (is converted into $Zm=H'$, $\overline{Zm}=L$).

Thereby, none of the logic elements 1S . . . /$\overline{1S . . .}$ of vertical P1 can be biased into conduction and reduce the high potential.

On the other hand, logic elements 1S1/2 and 1S2/2 of vertical line P2 and logic element 1S2/$n$ of vertical line P$n$ are biased into conduction. The potentials of these two vertical lines take on a low value.

Thus, only the charging-gate terminals of logic elements 2S . . . of vertical line P1 (viz., 2S1/1, 2S1/2 . . . 2S1/6) are at setting voltage potential. These logic elements can all or individually be blocked by means of a setting voltage potential connected to functional outputs F.

The blocking of logic elements 2S . . . of other vertical lines is effected in the same fashion. By way of example, signal elements having the following binaries are suitable for selecting vertical line P2:

$e1 = L$ (is converted into $Z1=L$, $\overline{Z1}=H'$)
$e2 = L$ (is converted into $Z2=L$, $\overline{Z2}=H'$) . . .
$em = L$ (is converted into $Zm=L$, $\overline{Zm}=H'$).

None of the logic elements 1S . . . /$\overline{1S . . .}$ of vertical line P2 can be biased into conduction and the setting voltage potential across this vertical line is maintained as a result. On the other hand, logic elements $\overline{1S1/1}$, $\overline{1S2/1}$ of vertical line P1 and $\overline{1S1/n}$ of vertical line P$n$ are biased into conduction, so that these two vertical lines are put at low potential.

Condition $q$ (unblocking of logic elements 2S . . .)

As explained for condition 1 (unblocking of charge-storage transistor T45) the logic elements may be unblocked via optical or electrical means. The optical method need no further explanation. The electrical unblocking can also be achieved in several ways. An example will be given of a method for adjusting logic elements 1S . . . /$\overline{S1 . . .}$ for the unblocking of logic elements 2S . . . .

The unblocking is achieved by destroying the negative charge of the electrically floating gate. To accomplish this, the charging-gate terminal of the logic element concerned must be put at low and the source region at high potential.

Using a signal $e$ having a suitable bit configuration and applied to input terminals E1, E2 . . . E$m$, one can cause at least one logic element 1S . . . /$\overline{1S . . .}$ of each vertical line P1, P2 ... Pn to be biased into conduction, with the result that each vertical line is put at low potential. For such a signal, a bit configuration is selected that was not utilized for any of the setting operations for logic elements 1S . . . /$\overline{1S}$ . . . , for example:

$e1 = L$ (is converted into $Z1 = L$, $\overline{Z1} = H'$)
$e2 = H$ (is converted into $Z2 = H'$, $\overline{Z2} = L$) . . .
$em = L$ (is converted into $Zm = L$, $\overline{Zm} = H'$).

In this potential configuration, logic elements $\overline{1S1}/1$, $\overline{1S2}/2$ and $\overline{1Sm}/n$ are biased into conduction, thereby putting all vertical lines at low potential. This potential is also taken on by the charging-gate terminals of all logic elements 2S . . . The high potential is impressed on the source terminals of all these logic elements across the source control terminal SST2, which for all other conditions is at a low potential.

By selecting other bit configurations for signals $e$, one can again, using the adjusted logic elements 1S . . . /$\overline{1S}$ . . . , carry out a columnwise unblocking of logic elements 2S . . .

Condition $r$ (unblocking of logic elements 1S . . . /$\overline{1S}$ . . . ):

A simple method of unblocking these logic elements via electrical means is through deactivation of the outlets of all input amplifiers VE, that is, applying signals having the binary L to all output $Z1$, $\overline{Z1}$; $Z2$, $\overline{Z2}$ . . . $Zm$, $\overline{Zm}$. This causes the application of a low potential to the charging-gate terminals of all logic elements 1S . . . /$\overline{1S}$ . . . The low potential across the source control terminal SST1 is switched off and replaced by a high potential, causing all hitherto blocked logic elements 1S . . . /1S . . . to be unblocked simultaneously by destroying the negative charge of their electrically floating gates.

The above practical example of the modular circuit built in accordance with the principles of this invention is so designed that the associated elements are placed in a single module produced by integrated semiconductor technique.

The advantageous switching technique used in designing the matrices M1 and M2 results in a further advantage for the mask design. For example, every two adjoining groups of logic elements (i.e., those assigned to every two adjoining vertical lines) may be placed on the chip area such that they have a common conductor path to the terminal of the source terminals. This results in space saving and packing density can be increased accordingly.

Finally, attention is drawn to a practical example of the modular circuit according to the invention in which signals to be applied thereto and comprising two or more signal elements are applied in serial-coded form to a special terminal, to which is connected a serial-parallel converter transmitting these signals in parallel-coded form to further elements associated with the modular circuit.

In the above preferred embodiments, logic elements that are designed as charge-storage transistors having electrically floating gates are disclosed. Accordingly, the principles of the invention are described hereinabove by describing the construction and operation of a preferred embodiment. The described embodiment is exemplary only, and it can be modified or changed in a number of ways known to those skilled in the art while remaining within the scope of the invention, as defined by the appended claims.

I claim:

1. A modular logic circuit, utilizing logic elements formed of reprogrammable charge-storage transistors connected in a matrix array by horizontal and vertical lines, for performing a plurality of different logic functions, said circuit having several input terminals to which input signals are applied whereby a particular logic output signal is obtained at output terminals of the circuit in accordance with said input signals and a previous setting of logic elements, wherein particular logic functions can be set and reset any number of times, comprising:

means for applying first setting signals to the input terminals wherein the setting signals, corresponding to a code, consist of separate signal elements;

means for simultaneously applying second setting signals to the output terminals wherein the setting signals, corresponding to a code, consist of separate signal elements;

a first group of said horizontal lines;

a second group of said horizontal lines, each horizontal line in said second group making up respective output signal paths connected to one of said output terminals;

each of said signal elements of the first setting signals being applied to a separate and distinct one of said horizontal lines in said first group; and, selector signal means (AS1 . . . ASp) for applying said second setting signals to activate at least one of said vertical lines.

2. The modular logic circuit as described in claim 1 wherein:

each of the first setting signals is applied to a separate and distinct horizontal line in said first group of said horizontal lines whereby only the logic elements connected to horizontal lines of said first group can be set;

the logic elements connected to horizontal lines of said second group are set by utilizing the previous setting of the logic elements connected to horizontal lines of said first group, whereby third setting signals are applied to the input terminals to set the remaining unset logic elements in a vertical line; and are simultaneously applied fourth setting signals to the output terminals associated with the logic elements to be set.

3. The modular logic circuit as described in claim 1 wherein:

each logic element, connected to the horizontal lines of the first group, is set by applying different first and second setting signals.

4. The modular logic circuit as described in claim 2 wherein:

each logic element, connected to horizontal lines of the second group, is set by applying different third and fourth setting signals.

5. The modular logic circuit as described in claim 1 further comprising an input amplifier connected to each input terminal, wherein said input amplifier includes:

a first driver stage having an input terminal and a negating output terminal;

a second driver stage having an input terminal and a negating output terminal, wherein the negating output terminal of the first driver stage is connected to the input terminal of the second driver stage and connected to a first horizontal line of said first group of horizontal lines;

wherein the negating output terminal of the second driver stage is connected to the second horizontal line of said first group of horizontal lines;

a threshold means for coupling the input of the first driver stage to first and second NOT gates, wherein the first NOT gate couples the output of the threshold means to the negating output of the first driver stage, and the second NOT gate couples the output of the threshold means to the negating output of the second driver stage;

wherein the application of an input signal to the input terminals having either a first or second level, the second level not being in excess of a predetermined magnitude, produces a high binary level signal at the first horizontal line and a low binary level signal at the second horizontal line, or vice versa; and, the application of an input signal having a magnitude in excess of the predetermined magnitude produces a low binary level signal at both the first and second horizontal lines.

6. The modular logic circuit as described in claim 5 further comprising:

logic elements having a charging gate terminal, a source terminal, and a drain terminal;

wherein the logic elements connected to horizontal lines of the first group, which are not to be set, have a low binary level signal applied to their charging gate terminal.

7. The modular logic circuit as described in claim 1 wherein:

the logic elements are field effect transistors having a charging gate terminal, a source terminal and a drain terminal;

only one field effect transistor is connected at each intersection of the vertical lines and the horizontal lines of the first and second group of horizontal lines;

the field effect transistors connected to horizontal lines of the first group have their charging gate connected to the horizontal lines of the first group;

the field effect transistors connected to horizontal lines of the second group have their drain gate terminals connected to the horizontal lines of the second group; and, the source gate terminals of the field effect transistors connected to horizontal lines of the first group are interconnected, and the source gate terminals of the field effect transistors connected to horizontal lines of the second group are interconnected.

8. The modular logic circuit as described in claim 7 wherein:

the source terminals of the field effect transistors connected to horizontal lines of the first group are connected to a first source control terminal whereby the field effect transistors can be switched to a set state by the application of a first potential or can be switched to an unblocked state by application of a second potential.

9. The modular logic circuit as described in claim 8 wherein:

the source terminals of the field effect transistors connected to horizontal lines of the second group are connected to a second source control terminal whereby the field effect transistors can be switched to a set state by the application of a first potential or can be switched to an unblocked state by the application of a second potential.

10. The modular logic circuit as described in claim 1 wherein:

the selector signal means comprises electronic selectors having a common reversing input terminal.

11. The modular logic circuit as described in claim 10, wherein:

the number of vertical lines is substantially greater than the number of output terminals; and, the electronic selectors switch the second setting signal applied to the output terminals to a decoder matrix.

12. The modular logic circuit as described in claim 11 wherein:

each output of the decoder matrix is connected to a respective vertical line;

a discharging switch means is provided in each vertical line to discharge spurious capacitance; and, a second control signal means is provided to actuate the discharge switch means at the end of a setting operation.

13. The modular logic circuit as described in claim 1 wherein the circuit is constructed in a single modular form by semi-conductor circuit techniques.

* * * * *